United States Patent [19]

Tokunaga et al.

[11] 4,277,696
[45] Jul. 7, 1981

[54] SEMICONDUCTOR SWITCH CIRCUIT

[75] Inventors: Michio Tokunaga, Zushi; Junjiro Kitano, Yokohama, both of Japan

[73] Assignee: Hitachi, Ltd., Tokyo, Japan

[21] Appl. No.: 27,838

[22] Filed: Apr. 6, 1979

[30] Foreign Application Priority Data

Oct. 13, 1977 [JP] Japan .................. 52-122600

[51] Int. Cl.³ .................................. H03K 17/60
[52] U.S. Cl. .................. 307/255; 307/288; 307/315
[58] Field of Search .......... 307/255, 252 C, 238, 307/315, 288

[56] References Cited

U.S. PATENT DOCUMENTS

| | | | |
|---|---|---|---|
| 3,292,005 | 12/1966 | Lee | 307/288 |
| 3,902,079 | 8/1975 | Ahmed | 307/255 |
| 4,031,412 | 6/1977 | Ohhinata et al. | 307/255 |

Primary Examiner—Stanley D. Miller, Jr.
Assistant Examiner—B. P. Davis
Attorney, Agent, or Firm—Craig & Antonelli

[57] ABSTRACT

A semiconductor switch circuit comprises first, second and third transistors. The complementary first and second transistors make up an inverted Darlington circuit. The third transistor with the base and collector thereof connected to the collector and base of the inverted Darlington circuit respectively makes up a positive feedback circuit with the inverted Darlington circuit. The conduction current of the switch circuit is split into two conduction currents flowing through the complementary first and second transistors making up the inverted Darlington circuit. By controlling the base current of at least one of the first and second transistors, the switch circuit is subjected to on-off control, thereby making it possible to reduce the required control power and increase the off-controllable load current.

8 Claims, 8 Drawing Figures

SEMICONDUCTOR SWITCH CIRCUIT

BACKGROUND OF THE INVENTION

1. Field of the Invention

The present invention relates to a semiconductor switch circuit which has a self-holding function and is capable of performing a large-current switching operation by a small controlling current.

2. Description of the Prior Art

By using a semiconductor switch such as a thyristor or a transistor in place of a mechanical contact switch, the performance of the switch circuit may be improved remarkably in speed, life, noise and compactness. The conventional semiconductor switch circuits, however, pose a problem with the on-off control thereof. In a semiconductor switch circuit using transistors, the base thereof is required to continue to be driven with a large current while it is in the on state. Another semiconductor switch circuit using a thyristor, on the other hand, has the characteristics of easy on-control and also the self-holding function, but the off-control thereof is impossible except with a thyristor of a special type. One of the off-controllable thyristors is called a gate turn-off thyristor (GTO). However, even in the case of a GTO, a larger driving power is required for off-control as compared with that for on-control, thus making on-off control difficult.

Under these circumstances, the Japanese laid-open patent publication No. 41482/75 suggests a method as shown in FIGS. 1 and 2 wherein a composite switch is made up of a thyristor and a transistor such that the off-control ability is improved by the current amplification effect of the transistor. In the circuit shown in FIG. 1, however, the off-control ability is greatly affected by the construction of the semiconductor devices making up the switch circuit. This restriction leads to the disadvantage of difficulty in circuit integration.

In FIG. 1, the complementary transistors $Tr_1$ and $Tr_2$, which are equivalent to a thyristor T, and a transistor $Tr_3$, driven by the N gate (GN) of this thyristor T, make up a switch circuit. When the current amplification factor ($h_{FE}$) of the transistor $Tr_3$ is large enough, the greatest part of the conduction current of the switch circuit flows between the collector and emitter of the transistor $Tr_3$, so that the current flowing in the thyristor T which is to be turned off is reduced, thus improving the off-control ability thereof.

The circuit of FIG. 1 is such that the bases and emitters of the transistors $Tr_2$ and $Tr_3$ are connected directly with each other respectively. Therefore, the base currents in the transistors $Tr_2$ and $Tr_3$ do not always flow equally, resulting in the lack of evenness of current flow depending on the relative difference in the magnitude of the internal resistances of the transistors $Tr_2$ and $Tr_3$. This is called a current hogging phenomenon which poses a problem in respect of electrical characteristics. In other words, if the base internal resistance of the transistor $Tr_2$ is smaller than the base internal resistance of the transistor $Tr_3$, substantially no base current flows in the transistor $Tr_3$. As a result, the collector current of the transistor $Tr_3$ is almost zero, thus lowering the off-control ability extremely. When the internal resistance of the transistor $Tr_2$ is larger than that of the transistor $Tr_3$, on the other hand, the base current of the transistor $Tr_2$ is reduced and the driving current of the thyristor T is increased, resulting in a lower sensitivity.

For this reason, it is necessary to achieve a construction of transistors $Tr_2$ and $Tr_3$ as shown in FIG. 2 in which the current hogging phenomenon is unlikely to occur. According to the structure of the device shown in FIG. 2, however, the off-control ability and the breakdown voltage are in a trade-off relation, thus making it impossible to maintain switch devices high in both the off-control ability and breakdown voltage. The device shown in FIG. 2 is so constructed that a P-type emitter layer 11 making up an anode A, an N-type base layer 12 making up an N gate (not shown), a P-type base layer 13 making up a gate G, and an N-type emitter layer 14 making up a cathode K are formed on a P-type substrate 10, thus constituting a thyristor T, with the P-type substrate 10 being connected electrically with the cathode K. In FIG. 1, the transistor $Tr_2$ is made up of the P-type emitter layer 11, the N-type base layer 12 and the P-type base layer 13 as the emitter, base and collector regions respectively. The transistor $Tr_3$, on the other hand, is made up of the P-type emitter layer 11, the N-type base layer 12 and the P-type substrate 10 as the emitter, base and collector regions respectively. In this construction, the base-emitter circuits of the transistors $Tr_2$ and $Tr_3$ share a common region, so that the base currents of the transistors $Tr_2$ and $Tr_3$ are equal to each other, thus obviating the above-mentioned problem of the current hogging phenomenon. In spite of this advantage, the structure of the device shown in FIG. 2 has such a shortcoming that if the current amplification factor $h_{FE}$ of the transistor $Tr_3$ is increased in order to improve the off-control ability, the breakdown voltage of the device is reduced. In other words, in order to increase the value $h_{FE}$ of the transistor $Tr_3$, it is necessary to reduce the thickness of the base layer thereof, i.e., the distance between P-type emitter layer 11 and the P-type substrate 10 in FIG. 2 (hereinafter called the N base thickness). The breakdown voltage of the device (forward off breakdown voltage), however, becomes lower as the N base thickness decreases. As seen from the foregoing explanation, the conventional circuit shown in FIG. 1 is greatly limited in the realization of integrated circuitry and is thus capable of being used only in a certain field of application such as one involving a low breakdown voltage.

SUMMARY OF THE INVENTION

An object of the present invention is to provide a semiconductor switch circuit which is on-off-controllable with a small control power, high in breakdown voltage and is easily constructed in the form of an integrated circuit.

According to the present invention, there is provided a semiconductor switch circuit comprising an inverted Darlington circuit including at least two complementary first and second transistors, and a third transistor making up a positive feedback circuit with the inverted Darlington circuit, the third transistor having the collector and base thereof connected to the base and collector of the inverted Darlington circuit respectively, the entire circuit being on-off-controllable by controlling at least one of the base currents of the first and second transistors.

DESCRIPTION OF THE PREFERRED EMBODIMENTS

Figure 3:
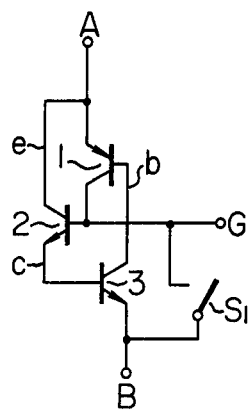
FIG. 3 is a diagram showing a circuit configuration of a first embodiment of the semiconductor switch circuit according to the present invention.

A circuit configuration of a first embodiment of the semiconductor switch circuit according to the present invention is shown in FIG. 3. This circuit is comprised of a first transistor 1, a second transistor 2 complementary with the first transistor 1, a third transistor 3, and a switch S1. The emitter of the first transistor 1 is connected with the collector of the second transistor, the collector of the first transistor connected with the base of the second transistor, the base of the first transistor connected with the collector of the third transistor, and the emitter of the second transistor connected with the base of the third transistor. The switch S1 is connected with both the base of the second transistor 2 and the emitter of the third transistor 3. For convenience's sake, the first transistor 1 is shown as PNP type, and the second and third transistors as NPN type, although they are not limited to such types, respectively. Instead, by reversing the directions of arrow marks of the emitters of respective transistors, the first transistor may take the form of NPN type, and then the second and third transistors may take the form of PNP type. In all the embodiments mentioned below, the complementary circuit may be formed in which the current flows in the opposite direction as mentioned above. The explanation below, however, will be made with reference to the circuits actually shown in the drawings. Turning back to FIG. 3, the PNP transistor 1 and the NPN transistor 2 make up an inverted Darlington circuit which operates equivalently to a PNP transistor. The emitter e, base b and the collector c of the equivalent PNP transistor in the inverted Darlington circuit correspond to the emitter of the PNP transistor 1 and the collector of the NPN transistor 2, the base of the PNP transistor 1 and the emitter of the NPN transistor 2, respectively. The collector of the equivalent PNP transistor is connected with the base of the NPN transistor 3, and the base of the equivalent transistor with the collector of the NPN transistor 3, so that the entire circuit functions equivalently to a PNPN switch or a thyristor. On the other hand, the collector of the PNP transistor 1 and the base of the NPN transistor 2 are connected to the control terminal G.

The operation of the switch circuit shown in FIG. 3 will be described below. First, assume that a current is supplied to the base of the NPN transistor 2 through the control terminal G. This current is amplified and flows out of the emitter of the NPN transistor 2 into the base of the NPN transistor 3, thereby driving the NPN transistor 3. The NPN transistor 3 is thus turned on and draws out the current from the base of the PNP transistor 1, so that the PNP transistor 1 is also turned on. As a result, current is supplied from the collector of the PNP transistor 1 to the base of the NPN transistor 2.

Even after the current supply is stopped from the control terminal G, the three transistors 1, 2 and 3 making up the switch circuit continue to be kept in the on-state. In other words, this switch circuit makes up a positive feedback circuit. On the other hand, the off-control of this switch circuit is achieved by turning on i.e., closing the control switch S1 inserted between the terminal G and the emitter of the NPN transistor 3. Upon closing of the control switch S1, the collector current of the PNP transistor 1 which has driven the base of the NPN transistor 2 is bypassed to the emitter terminal of the NPN transistor 3 through the control switch S1, so that the NPN transistor 2 is turned off. The base current of the NPN transistor 3 stops being supplied, thus turning off the NPN transistor 3. As a result, the current being drawn from the base of the PNP transistor 1 is stopped, thereby turning off the PNP transistor 1. In this way, all the transistors, 1, 2 and 3 making up the switch circuit are turned off. If the control switch S1 is turned off, i.e., opened at this time point, the switch circuit is restored to the initial state.

The method of off-control of the switch circuit is not limited to the above-mentioned one in which the control switch S1 is used. As an alternative, it is sufficient if means is provided to cause the collector current of the PNP transistor 1 to bypass. For instance, current may be drawn from the control terminal G by means of a constant current circuit or the like.

During the on state of the switch circuit configured as shown in FIG. 3, the conduction current flowing between the switch terminals A and B is divided into the conduction currents of the PNP transistor 1 and the NPN transistor 2. Since the collector current of the PNP transistor 1 makes up the base current of the NPN transistor 2, the current amplifying function of the NPN transistor 2 causes a larger current proportional to the amount of current amplification factor thereof to flow in the NPN transistor 2 than in PNP transistor 1. In the off-control of the switch circuit, therefore, the collector current of the PNP transistor 1 to be bypassed is reduced to an amount much smaller than the entire conduction current of the switch circuit. As a result, a small current capacity suffices in the off-control of the switch circuit. If a transistor is used as the control switch S1, for example, the advantage results that the control power required for off-control of the switch circuit is small. Also, the control power being the same, the maximum load current permitting the off-control is increased.

Figure 1:
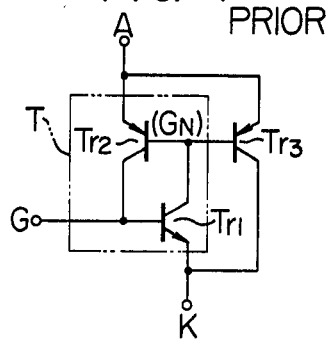
FIG. 1 is a circuit diagram showing a well-known semiconductor switch circuit which is most similar to the present invention.
Figure 2:
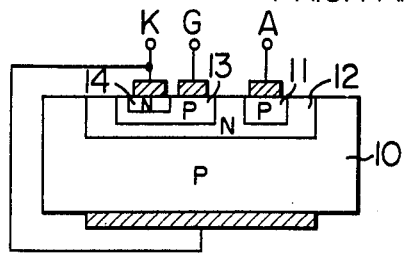
FIG. 2 is a diagram showing the structure of a device in which the circuit of FIG. 1 is integrated.

Further, in view of the fact that the NPN transistor 2 having the function to improve the off-control ability is driven by the collector of the PNP transistor 1, both the deterioration of the off-control ability due to the current hogging phenomenon which posed a problem in the prior art of FIG. 1 and the lowering in sensitivity caused by an increased driving current are eliminated. Therefore, unlike in the prior art circuit shown in FIG. 2, no means is required in the structure of the device to prevent the current hogging phenomenon, thus facilitating circuit integration. Further, since the NPN transistor 2 determining the off-control ability may be formed as a widely-used vertical NPN transistor, it is possible to increase both the current amplification factor $h_{FE}$ and the breakdown voltage of the device or the forward off breakdown voltage at the same time. Thus a semiconductor switch circuit is obtained which is free from the trade-off relation between the off-control ability and the breakdown voltage of the device unlike in the prior art circuits.

Figure 4:
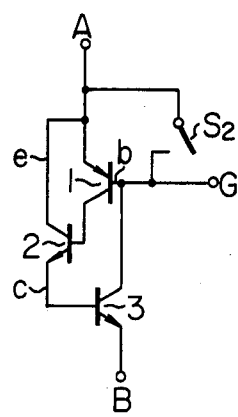
FIG. 4 is a diagram showing a circuit configuration of a second embodiment of the semiconductor switch circuit according to the present invention.

A circuit configuration of a second embodiment of the semiconductor switch circuit according to the present invention is shown in FIG. 4. Unlike in the embodiment of FIG. 3 wherein the control terminal G is taken from the base of the NPN transistor 2, the control terminal G in the embodiment under consideration is taken from the base of the PNP transistor 1. In the switch circuit shown in FIG. 4, the switch circuit is turned on by drawing the current from the control terminal G and the control switch S2 is closed thereby to turn off the switch circuit. The operating principle of this circuit which is similar to that of the circuit of FIG. 3 will not be described in detail. When the current is taken from the terminal G, the PNP transistor 1 is activated, so that the NPN transistor 2, the NPN transistor 3 and the PNP transistor 1 are turned on in that order, thus turning on the switch circuit. This switch circuit has a self-holding function like the circuit of FIG. 3. Next, upon closing of the control switch S2, the PNP transistor 1 is turned off, so that the NPN transistor 2 and the NPN transistor 3 are turned off in that order, thus turning off the switch circuit. Also in this switch circuit shown in FIG. 4, the greatest part of the conduction current of the switch flows through the NPN transistor 2, and therefore the circuit is easily off-controllable circuit in the same manner as FIG. 3, thereby leading to the advantages of a reduced control power and an increased maximum off-controllable load current.

As described above, the conduction current of the switch circuit is divided by the two complementary transistors making up the inverted Darlington circuit, thus making it possible to reduce the control power on the one hand and to increase the off-controllable load current on the other hand. In the embodiments of FIGS. 3 and 4, only one of the base currents of the complementary transistors is controlled. Instead, both of the base currents of the complementary transistors may of course be controlled.

Figure 5:
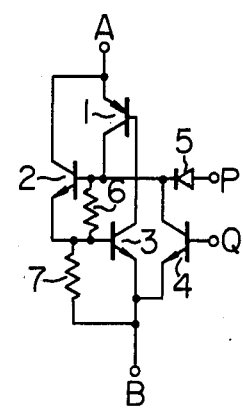
FIGS. 5, 6, 7 and 8 are diagrams showing circuit configurations of third, fourth, fifth, sixth and seventh embodiments of the semiconductor switch circuit according to the present invention, respectively.

A specific circuit configuration of the switch circuit according to a third embodiment of the present invention is shown in FIG. 5. The circuit of FIG. 5 which is a diagram showing the actual circuit the embodiment of FIG. 3 will not be described in detail. Current is supplied from the control terminal P through the diode 5, thus turning on the switch circuit. If the NPN transistor 4 is driven by the control terminal Q, on the other hand, the switch circuit is restored to the off state. As is apparent from the above, the NPN transistor 4 is equivalent to the control switch S1 of FIG. 1. A resistor 6 connected between the base and emitter of the NPN transistor 2 and a resistor 7 connected between the base and emitter of the NPN transistor 3 are provided for the purpose of preventing a misfire which otherwise might occur due to the leakage current at a high temperature of the transistors making up the switch circuit or a steep rise voltage dv/dt applied between the terminals A and B. The substantial self-holding ability of the switch circuit is established by the resistors 6 and 7. If the DC current flowing in the load circuit not shown is set at a level slightly larger than the self-holding current, the switch circuit can be held on by pulsedriving from the control terminal P.

Figure 6:
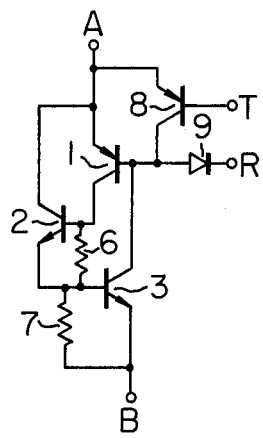

A specific circuit configuration according to a fourth embodiment of the present invention is shown in FIG. 6. The embodiment of FIG. 6, which is an actual circuit configuration of that shown in FIG. 4, will not be described in detail. The switch circuit is turned on by taking the current from the control terminal R through the diode 9. If the current is taken from the control terminal T to drive the transistor 8 thereby turning on the transistor 8, the switch circuit is restored to the off state. The transistor 8 is equivalent to the control switch S2 of FIG. 4. The resistors 6 and 7 have the same functions as those in FIG. 5.

Figure 7:
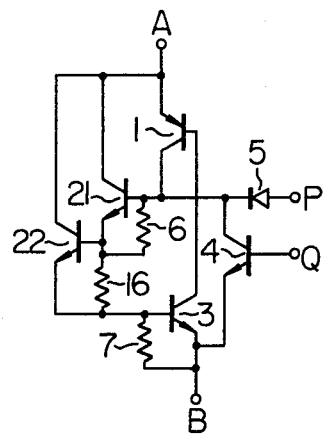

The configuration of the switch circuit according to a fifth embodiment of the present invention is shown in FIG. 7. The operation of the circuit is quite similar to that of the circuit shown in FIG. 5. The only difference in configuration lies in that the NPN transistor 2 of FIG. 5 is replaced by a Darlington circuit of the NPN transistor 21 and the NPN transistor 22 in FIG. 7. This circuit configuration of FIG. 7 makes it possible to further increase the maximum off-controllable load current.

Figure 8:
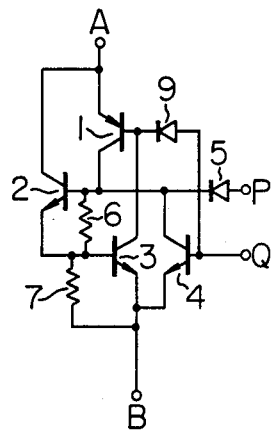

The configuration of the switch circuit according to a sixth embodiment of the present invention is shown in FIG. 8. In addition to the circuit devices included in FIG. 5, the embodiment under consideration includes a diode 9 connected between bases of the PNP transistor 1 and the NPN transistor 4. In this configuration, it is entirely possible to prevent the switch circuit from being erroneously turned on, which otherwise might occur due to the transient driving of the transistor 4, by virtue of the fact that such a transient will current charge the junction capacitance of the diode 9 even when a steep rising voltage dv/dt is applied between the terminals A and B of the switch circuit in off state. In the on state of the switch circuit, no current flows in the diode 9, and therefore the transistor 4 is not driven, thus preventing any adverse effect on the circuit operation.

It will be thus understood from the foregoing description that according to the present invention a semiconductor switch circuit is provided which is subjected to on-off control with a small control power, is high in the breakdown voltage of the devices and easy in circuit integration.

We claim:

1. A semiconductor switch circuit comprising:
    an inverted Darlington circuit including at least a first and a second transistor which are complementary to each other, the emitter of said first transistor being connected to the collector of said second transistor and the base of said second transistor being connected to the collector of said first transistor in a manner so that the emitter of said first transistor and the collector of said second transistor comprises an equivalent emitter of said inverted Darlington circuit, and that the emitter of said second transistor comprises an equivalent collector of said inverted Darlington circuit, and that the base of the first transistor comprises an equivalent base of said inverted Darlington circuit;
    a third transistor having a base and a collector connected to the equivalent collector and base of said inverted Darlington circuit, correspondingly and respectively, thereby to constitute a positive feedback circuit therebetween; and
    means for executing on-off control of at least a selected one of said first and second transistors constituting said inverted Darlington circuit.

2. A semiconductor switch circuit according to claim 1, wherein said Darlington circuit includes a first transistor and a second transistor complementary with said first transistor and having a current amplifying function, said switch circuit further including a resistor inserted between the base and emitter of said second transistor.

3. A semiconductor switch circuit according to claim 1, wherein said inverted Darlington circuit includes a first transistor and a pair of second transistors making up inverted Darlington transistors complementary with said first transistor and having the current amplifying function, said switch circuit further comprising a resistor inserted between the base and emitter of each of said two second transistors.

4. A semiconductor switch circuit according to claim 2 or 3, further comprising a resistor inserted between the base and emitter of said third transistor.

5. A semiconductor switch circuit according to claim 1, wherein said on-off control means for said transistors of said inverted Darlington circuit includes a control terminal connected to the base of one of said transistors of said inverted Darlington circuit, and a control switch which can be subjected to on-off control and inserted between said control terminal and selected one of the emitter of said third transistor and the emitter of said first transistor.

6. A semiconductor switch circuit according to claim 5, wherein said control switch includes a transistor.

7. A semiconductor switch circuit according to claim 6, further comprising a capacitor inserted between the base of said transistor of said control circuit and said inverted Darlington circuit.

8. A semiconductor switch circuit comprising:
an inverted Darlington circuit including at least a first and a second transistor which are complementary to each other, the emitter of said first transistor being connected to the collector of said second transistor and the base of said second transistor being connected to the collector of said first transistor in a manner so that the emitter of said first transistor and the collector of said second transistor comprises an equivalent emitter of said inverted Darlington circuit, and that the emitter of said second transistor comprises an equivalent collector of said inverted Darlington circuit, and that the base of the first transistor comprises an equivalent base of said inverted Darlington circuit;

a third transistor having a base and a collector connected to the equivalent collector and base of said inverted Darlington circuit, correspondingly and respectively, thereby to constitute a positive feedback circuit therebetween;

on-control means coupled to the junction of the base of the second transistor and the collector of the first transistor to turn on the semiconductor switch, wherein, in response to a signal from the on-control means, the semiconductor switch will remain on due to the positive feedback from the third transistor even after the signal from the on-control means stops; and off-control means coupled to the base of one of the first and second transistors to cut-off the semiconductor switch by bypassing the base current of said first or second transistor.

* * * * *